(12) United States Patent
Hwang et al.

(10) Patent No.: US 9,615,449 B2
(45) Date of Patent: Apr. 4, 2017

(54) FOLDABLE DISPLAY DEVICE

(71) Applicant: Samsung Display Co., Ltd., Yongin, Gyeonggi-Do (KR)

(72) Inventors: Seong-Jin Hwang, Yongin (KR); Kwan-Young Han, Yongin (KR); Sang-Gu Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 171 days.

(21) Appl. No.: 13/742,668

(22) Filed: Jan. 16, 2013

(65) Prior Publication Data
US 2014/0029212 A1  Jan. 30, 2014

(30) Foreign Application Priority Data

Jul. 26, 2012  (KR) .................. 10-2012-0081862

(51) Int. Cl.
*H05K 1/00* (2006.01)
*H05K 1/02* (2006.01)
*G09F 9/33* (2006.01)

(52) U.S. Cl.
CPC .............. *H05K 1/028* (2013.01); *G09F 9/33* (2013.01); *H05K 2201/10128* (2013.01); *H05K 2201/2009* (2013.01)

(58) Field of Classification Search
USPC .................................................. 361/749, 748
See application file for complete search history.

(56) References Cited

U.S. PATENT DOCUMENTS

| 7,414,594 | B2 | 8/2008 | Kim et al. | |
|---|---|---|---|---|
| 2004/0036818 | A1* | 2/2004 | Kim et al. | 349/58 |
| 2004/0172820 | A1 | 9/2004 | Lopez | |
| 2006/0002062 | A1* | 1/2006 | Kwon et al. | 361/680 |
| 2008/0002968 | A1* | 1/2008 | Arai | G03B 17/14 396/448 |
| 2011/0050668 | A1* | 3/2011 | Park | G09G 3/3426 345/211 |
| 2011/0210937 | A1 | 9/2011 | Kee et al. | |
| 2012/0147599 | A1 | 6/2012 | Shim et al. | |
| 2012/0243207 | A1 | 9/2012 | Wang et al. | |

FOREIGN PATENT DOCUMENTS

| CN | 1403907 A | 3/2003 |
|---|---|---|
| CN | 1483282 A | 3/2004 |
| CN | 1763590 A | 4/2006 |
| CN | 1262116 C | 6/2006 |
| CN | 101573879 A | 11/2009 |
| KR | 10-0718102 | 5/2005 |
| KR | 10-2008-0086268 | 9/2008 |
| KR | 10-2011-0098349 | 9/2011 |
| KR | 10-2012-0012092 | 2/2012 |

* cited by examiner

*Primary Examiner* — Andargie M Aychillhum
(74) *Attorney, Agent, or Firm* — Robert E. Bushnell, Esq.

(57) ABSTRACT

A foldable display device having an excellent folding characteristic without image quality deterioration on a folding portion is provided. The foldable display device includes a flexible display panel and a cover window positioned outside the flexible display panel and protecting the flexible display panel from an external impact, wherein the cover window includes a folding region where concave grooves are formed.

19 Claims, 9 Drawing Sheets

FOLDABLE DISPLAY DEVICE

CLAIM PRIORITY

This application makes reference to, incorporates the same herein, and claims all benefits accruing under 35 U.S.C. §119 from an application earlier filed in the Korean Intellectual Property Office on 26 Jul. 2012 and there duly assigned Ser. No. 10-2012-0081862.

BACKGROUND OF THE INVENTION

Field of the Invention

The described technology relates generally to a foldable display device.

Description of the Related Art

Display devices using flexible display panels may realize a large screen when unfolded while being conveniently carried, and may be applied to various fields such as a television and a monitor, as well as mobile equipment such as a mobile phone, an ultra-mobile PC, an electronic book, and electronic paper.

The above information disclosed in this Related Art section is only for enhancement of understanding of the background of the described technology and therefore it may contain information that does not form the prior art that is already known in this country to a person of ordinary skill in the art.

SUMMARY OF THE INVENTION

The present invention provides a foldable display device including a transparent window that does not generate image quality deterioration at a folded portion with an excellent folding characteristic.

A foldable display device according to an exemplary embodiment includes a flexible display panel and a cover window positioned outside the flexible display panel and protecting the flexible display panel from an external impact, wherein the cover window includes a folding region where concave recesses such as concave grooves are formed.

The concave grooves may be formed with a stripe pattern, and are positioned according to a direction crossing a direction in which the cover window is folded. Each length of the concave grooves may be the same as a width of the cover window.

The concave grooves may be formed with a dot shape, and may be positioned according to a first direction in which the cover window is folded and a second direction crossing the first direction.

The concave grooves may be formed with a bar shape, the cover window may be folded according to a first direction, and each long edge of the concave grooves may be positioned according to a second direction crossing the first direction.

The concave grooves may include first concave grooves of a bar shape and second concave grooves of a dot shape. The first concave grooves and the second concave grooves may be alternately positioned one by one according to a second direction crossing a first direction in which the cover window is folded.

Each width of the concave grooves and an interval of the concave grooves may be determined in a range of 40 nm to 100 nm. Each depth of the concave grooves may be less than half of a thickness of the cover window.

The cover window may be manufactured of a hard material and a pair of non-folding regions positioned at respective sides of the folding region. The cover window may be a single layer structure or a multi-layer structure including at least one of an acryl, a polycarbonate, and polyethylene terephthalate.

A supporting member supporting the flexible display panel and the cover window may be further included, wherein the supporting member may include a hinge part corresponding to the folding region and a first supporting part and a second supporting part respectively corresponding to a pair of non-folding regions.

The cover window is manufactured of a hard material such that the flexible display panel is safely protected from the external impact, and the mechanical motion is smooth thereby being easily folded. Also, the cover window does not generate image quality deterioration such as a luminance deterioration of the screen or a boundary area, and a material change is not needed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
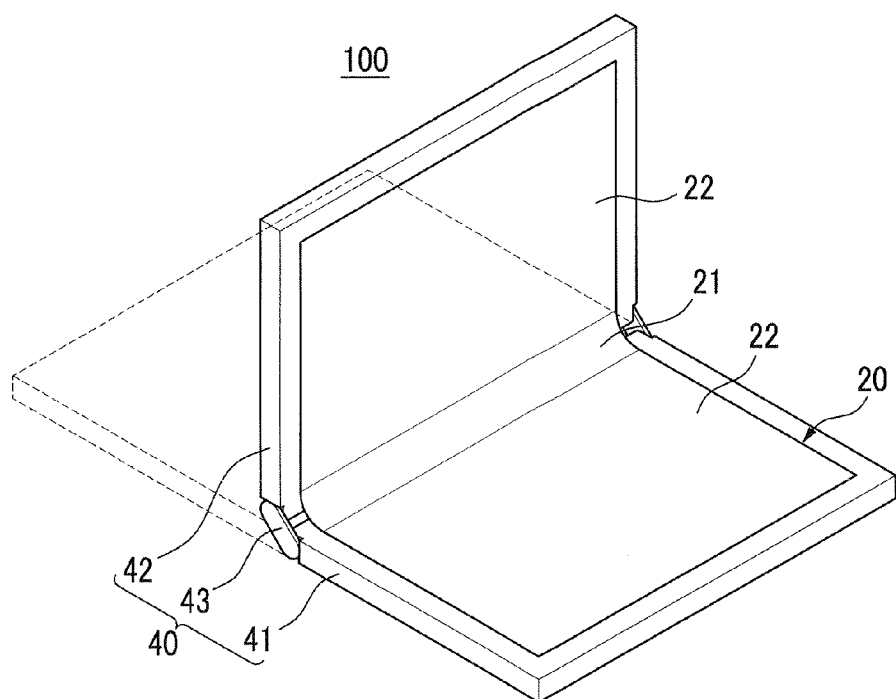
FIG. 1 is a perspective view of a foldable display device according to the first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Parts that are irrelevant to the description are omitted in order to clearly describe the present invention, and like reference numerals designate like elements throughout the specification. Furthermore, the size and thickness of respective structural components shown in the drawings are arbitrarily illustrated for explanatory convenience, and the present invention is not necessarily limited to as illustrated.

In the drawings, the thickness of layers, films, panels, regions, etc., are exaggerated for clarity. In addition, in order to clarify some layers and some regions, thicknesses and sizes thereof are enlarged in the drawings. It will be understood that when an element such as a layer, film, region, or substrate is referred to as being "on" another element, it can be directly on the other element or intervening elements may also be present.

The inventive concept of the example embodiments may, however, be embodied in many different forms and should not be construed as limited to the example embodiments set forth herein. In the drawings, the sizes and relative sizes of layers and regions may be exaggerated for clarity.

It will be understood that when an element or layer is referred to as being "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Generally, a foldable display device may allow for a large screen when unfolded while being conveniently carried. The foldable display device generally may include a cover window protecting the flexible display panel. The cover window may be easily folded and image quality deterioration must not be generated on the folded portion.

Figure 2:
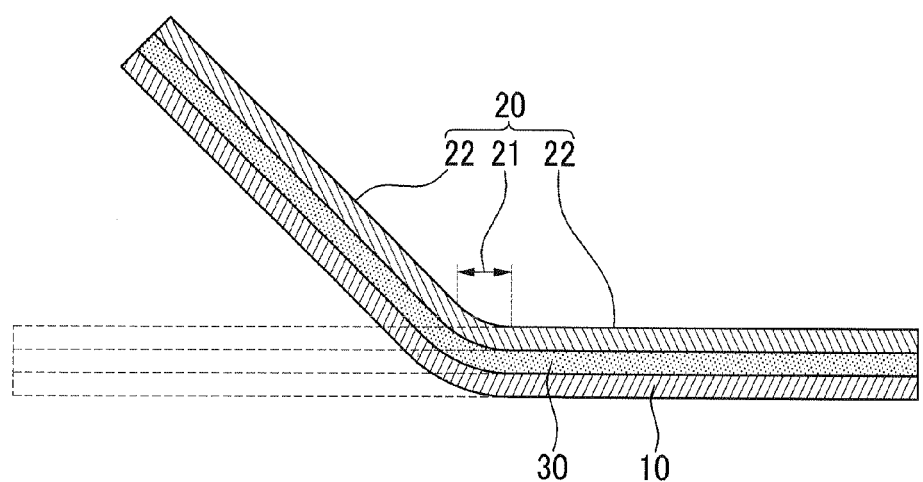
FIG. 2 is a partial cross-sectional view of the foldable display device shown in FIG. 1.

FIG. 1 is a perspective view of a foldable display device according to the first exemplary embodiment, and FIG. 2 is a partial cross-sectional view of the foldable display device shown in FIG. 1.

Referring to FIG. 1 and FIG. 2, a foldable display device 100 according to the first exemplary embodiment includes a flexible display panel 10 and a cover window 20 overlapping the flexible display panel 10 and protecting the flexible display panel 10 from an external impact.

The flexible display panel 10 includes a flexible film such as a plastic film, and displays an image by disposing an organic light emitting diode (OLED) and a pixel circuit on the flexible film. A detailed structure of the flexible display panel 10 will be described later. A touch panel 30 sensing a touch operation of a user may be positioned between the flexible display panel 10 and the cover window 20.

The flexible display panel 10 and the cover window 20 may be fixed to a supporting member 40. The supporting member 40 may include a first supporting part 41 and a second supporting part 42, and a hinge part 43 connecting them. The supporting member 40 is folded or unfolded with respect to the hinge part 43, and the flexible display panel 10 and the cover window 20 are also folded or unfolded with respect to the hinge part 43 according to the operation of the supporting member 40.

The cover window 20 is positioned outside a side where the image is displayed in the flexible display panel 10, and it is manufactured of a transparent hard material thereby protecting the flexible display panel 10 from external impact while transmitting an image of the flexible display panel 10 as it is. The cover window 20 may be formed of a single layer structure or a multi-layer structure including at least one of an acryl, a polycarbonate (PC), and polyethylene terephthalate (PET). FIG. 2 shows an example of the cover window 20 with the single layer structure.

Figure 3:
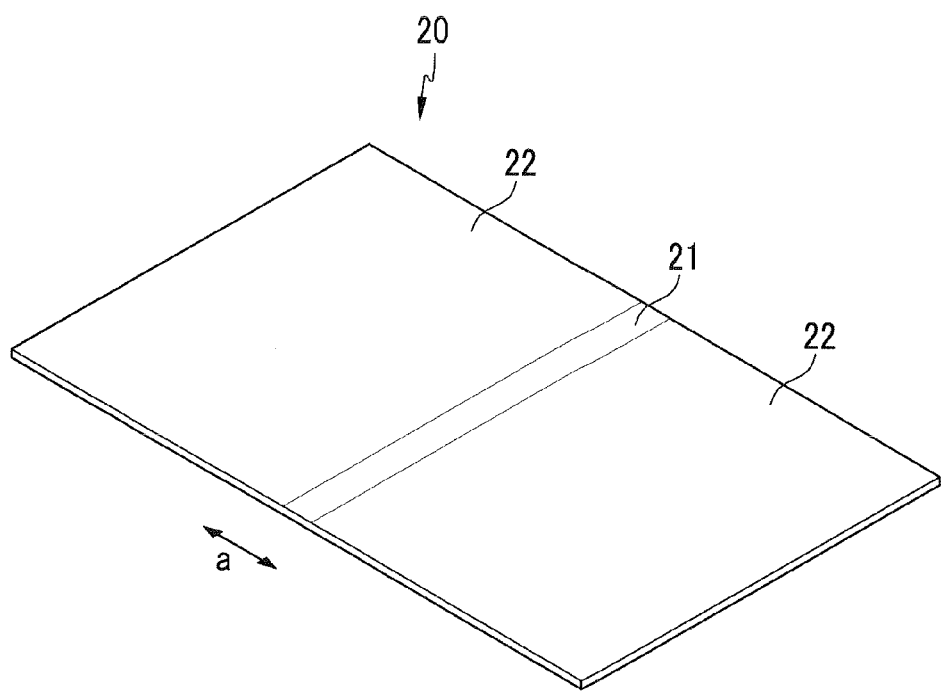
FIG. 3 is a perspective view of the cover window shown in FIG. 2.
Figure 4:
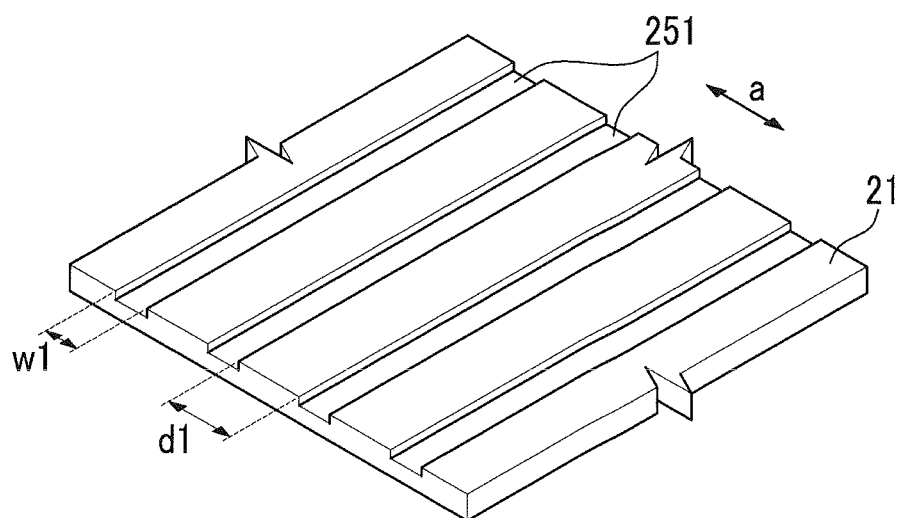
FIG. 4 is a partial enlarged view of the folded region shown in FIG. 3.

FIG. 3 is a perspective view of the cover window shown in FIG. 2, and FIG. 4 is a partial enlarged view of the folded region shown in FIG. 3.

Referring to FIG. 3 and FIG. 4, the cover window 20 includes a folding region 21 including a plurality of concave recesses 251 such as concave 251 and a non-folding region 22 positioned at both sides of the folding region 21. The folding region 21 is positioned corresponding to the hinge part 43 of the supporting member 40, and the non-folding region 22 is positioned corresponding to the first supporting part 41 and the second supporting part 42 of the supporting member 40. The concave grooves 251 are not formed in the non-folding region 22.

The concave grooves 251 may be formed on the outer surface of the cover window 20 exposed outside the foldable display device 100 by a chemical process such as etching or a physical process such as laser processing and imprinting. The concave grooves 251 reduce a surface volume of the cover window 20 in the folding region 21 thereby making it easy to fold the cover window 20 of the hard material.

In the foldable display device 100 of the first exemplary embodiment, the concave grooves 251 are formed with a stripe pattern. The concave grooves 251 may be formed according to a direction crossing a direction that the cover window 20 is folded (in FIG. 3 and FIG. 4, an arrow direction). Each length of the concave grooves 251 may be the same as a width of the cover window 20. That is, the concave grooves 251 may extend from one side of the cover window 20 to the other side thereof.

The concave grooves 251 have a predetermined width and a predetermined depth, and may be disposed at equal intervals with a predetermined interval therebetween. A cross-section of the concave groove 251 may be formed with various shapes such as quadrangle, triangle, rhombus, semiellipse, and semicircle shapes. In FIG. 4, the concave grooves 251 may have a quadrangle shape as one example.

As described above, when forming the concave grooves 251 in the folding region 21 of the cover window 20, although the cover window 20 is formed of the hard material, mechanical motion is smooth in the folding region 21 thereby being smoothly folded. Accordingly, the folding region 21 of the cover window 20 realizes the same effect as if the cover window 20 was formed of a soft material through the concave grooves 251. When a cover window that includes a folding region made of the soft material, a boundary between the soft material and the hard material may need to be measured and the manufacturing process becomes more complicated. Also, the use of a general soft material has low transmittance such that the luminance of the screen may be deteriorated, and the integrity is low such that the folding region may be easily damaged and the soft material may be changed when using the cover window.

However, the foldable display device 100 of the first exemplary embodiment does not use such a soft material such that the manufacturing of the cover window 20 is simplier and easier, the image quality deterioration such as the luminance deterioration of the screen or the boundary region is not generated, and the change of the material is not generated when using the cover window 20. Also, the hard cover window 20 may safely protect the flexible display panel 10 from external impact.

The width and the interval of the concave grooves 251 is in range of a nanometer scale. The nanometer scale means a size including the range more than 1 nm to less than 1000 nm. As the concave grooves 251 are formed in the range of the nanometer scale, the folding region 21 including the concave grooves 251 does not generate interference for the screen realized by the flexible display panel 10.

In detail, each width (w1, referring to FIG. 4) of the concave grooves 251 and the interval (d1, referring to FIG. 4) of the concave grooves 251 may be determined in a range of 40 nm to 100 nm. If each width w1 of the concave grooves 251 and the interval d1 of the concave grooves 251 is less than 40 nm, pattern accuracy of the concave grooves 251 may be deteriorated when processing them, while if each width w1 of the concave grooves 251 and the interval d1 of the concave grooves 251 is more than 100 nm, interference is generated for the image of the flexible display panel 10 such that the image quality deterioration may be generated in the folding region 21.

Visible rays have a wavelength region of 380 nm to 780 nm, and when the visible rays pass through the cover window 20, if each width w1 of the concave grooves 251 and the interval d1 of the concave grooves 251 is more than 100 nm, light is overlapped by the interference of the light, and the interference that is perceived by eyes such as moiré may be generated by reinforcement or extinction of the light.

Each depth of the concave grooves 251 may be less than half of a thickness of the cover window 20, particularly two-thirds. If the depth of the concave groove 251 is more than half of the thickness of the cover window 20, the interference of the light is generated such that the image quality deterioration may be generated, and a mechanical defect and damage to the cover window 20 may be generated.

Also, the width of the folding region 21 formed with the concave grooves 251 may be less than 3 cm, particularly 1 cm. If the width of the folding region 21 is larger than 3 cm, the region (folding region 21) that is curved when folding the foldable display device 100 has an excessive width such that design of the hinge part 43 or the supporting member 40 may be limited, and the mechanical defect and the damage of the cover window 20 may be generated.

In the foldable display device 100 of the first exemplary embodiment, the cover window 20 may be easily folded because of the concave grooves 251 in the folding region 21, and a curvature value that may be folded in maximum may be increased. Also, the folding region 21 of the cover window 20 maintains the same transmittance as the non-folding region 22 such that the screen luminance is not deteriorated, and the interference with the screen is not generated such that the image quality deterioration is not generated.

Figure 5:
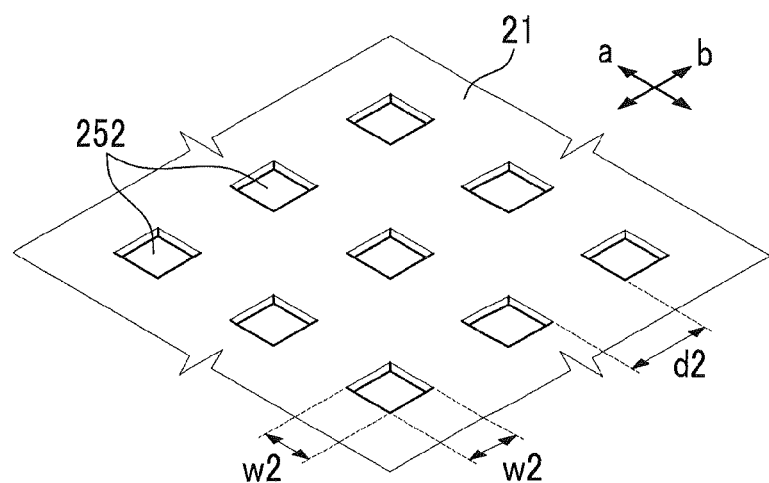
FIG. 5 is a partial enlarged perspective view of a folding region of a cover window in a foldable display device according to the second exemplary embodiment.

FIG. 5 is a partial enlarged perspective view of a folding region of a cover window in a foldable display device according to the second exemplary embodiment.

Referring to FIG. 5, a foldable display device according to the second exemplary embodiment is the same as the foldable display device of the first exemplary embodiment except for a dot pattern forming concave grooves 252 in the folding region 21 of the cover window 20. The same members as in the first exemplary embodiment are indicated by the same reference numerals, and differences from the first exemplary embodiment will be described.

The concave grooves 252 are formed with the dot shape not to have directivity in a particular direction, and may have a square, a triangle, or a circle shape. In FIG. 5, the square concave groove 252 is shown as an example. The concave grooves 252 are disposed with equal intervals in the first direction ("a" arrow direction) in which the cover window 20 is folded and the second direction ("b" arrow direction) crossing the first direction.

Like the first exemplary embodiment, each width w2 of the concave grooves 252 and the interval d2 of the concave grooves 252 may be determined in the range of 40 nm to 100 nm. Each depth of the concave grooves 252 may be less than half of the thickness of the cover window 20, and the width of the folding region 21 may be less than 3 cm. The concave grooves 252 of the second exemplary embodiment smoothens the mechanical motion of the folding region 21, and the image quality deterioration due to the interference is not generated.

Figure 6:
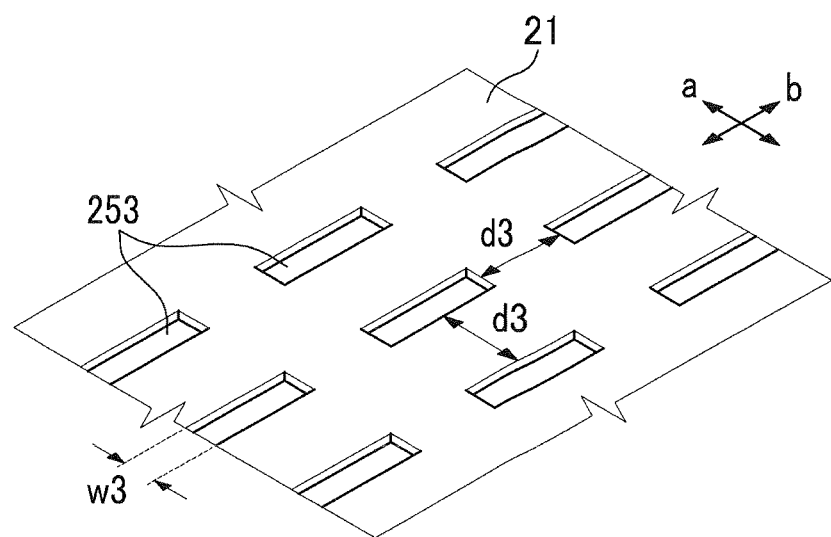
FIG. 6 is a partial enlarged perspective view of a folding region of a cover window in a foldable display device according to the third exemplary embodiment.

FIG. 6 is a partial enlarged perspective view of a folding region of a cover window in a foldable display device according to the third exemplary embodiment.

Referring to FIG. 6, a foldable display device of the third exemplary embodiment is the same as the foldable display device of the first exemplary embodiment except for a bar pattern of concave grooves 253 in the folding region 21 of the cover window 20. The same members as in the first exemplary embodiment are indicated by the same reference numerals, and differences from the first exemplary embodiment will be described.

The concave grooves 253 are formed with the bar shape having predetermined directivity. The concave grooves 253 may be respectively formed with the rectangular shape or may be formed with a track shape of which both ends thereof are rounded. In FIG. 6, the concave groove 253 of the rectangular shape is provided as one example. The long edge of the concave grooves 253 is positioned according to the second direction (the "b" arrow direction) crossing the first direction (the "a" arrow direction) in which the cover window 20 is folded, and the concave grooves 253 are disposed at equal intervals according to the first direction and the second direction.

As with the first exemplary embodiment, each width w3 of the concave grooves 253 and the interval d3 of the concave grooves 253 may be determined in the range of 40 nm to 100 nm. Each depth of the concave grooves 253 may be less than half of the thickness of the cover window 20, and the width of the folding region 21 may be less than 3 cm. The concave grooves 253 of the third exemplary embodiment smoothes the mechanical motion of the folding region 21, and the image quality deterioration due to the interference is not generated FIG. 7 is a partial enlarged perspective view of a folding region of a cover window in a foldable display device according to the fourth exemplary embodiment.

Figure 7:
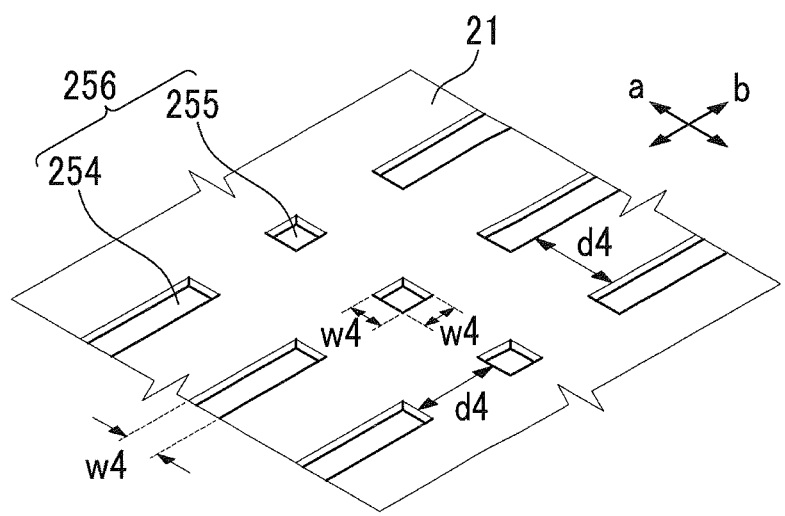
FIG. 7 is a partial enlarged perspective view of a folding region of a cover window in a foldable display device according to the fourth exemplary embodiment.

Referring to FIG. 7, a foldable display device of the fourth exemplary embodiment is the same as the foldable display device of the second exemplary embodiment or the third exemplary embodiment except for an arrangement in which concave grooves 254 of the bar shape and concave grooves 255 of the dot shape are mixed in the folding region 21 in the cover window 20. Next, differences from the second exemplary embodiment or the third exemplary embodiment will be described.

Concave grooves 256 may include the first concave grooves 254 of the bar shape and the second concave grooves 255 of the dot shape. The first concave grooves 254 are positioned in one line according to the first direction (the "a" arrow direction) in which the cover window 20 is folded, and the second concave grooves 255 are also positioned in one line according to the first direction. Also, the first concave grooves 254 and the second concave grooves 255 are alternately positioned according to the second direction (the "b" arrow direction) crossing the first direction.

As with the first exemplary embodiment, each width w4 of the concave grooves 254 and the interval d4 of the concave grooves 254 may be determined in the range of 40 nm to 100 nm. Each depth of the concave grooves 256 may be less than half of the thickness of the cover window 20, and the width of the folding region 21 may be less than 3 cm. The concave grooves 256 of the fourth exemplary embodiment smooth the mechanical motion of the folding region 21, and the image quality deterioration due to the interference is not generated.

Figure 8:
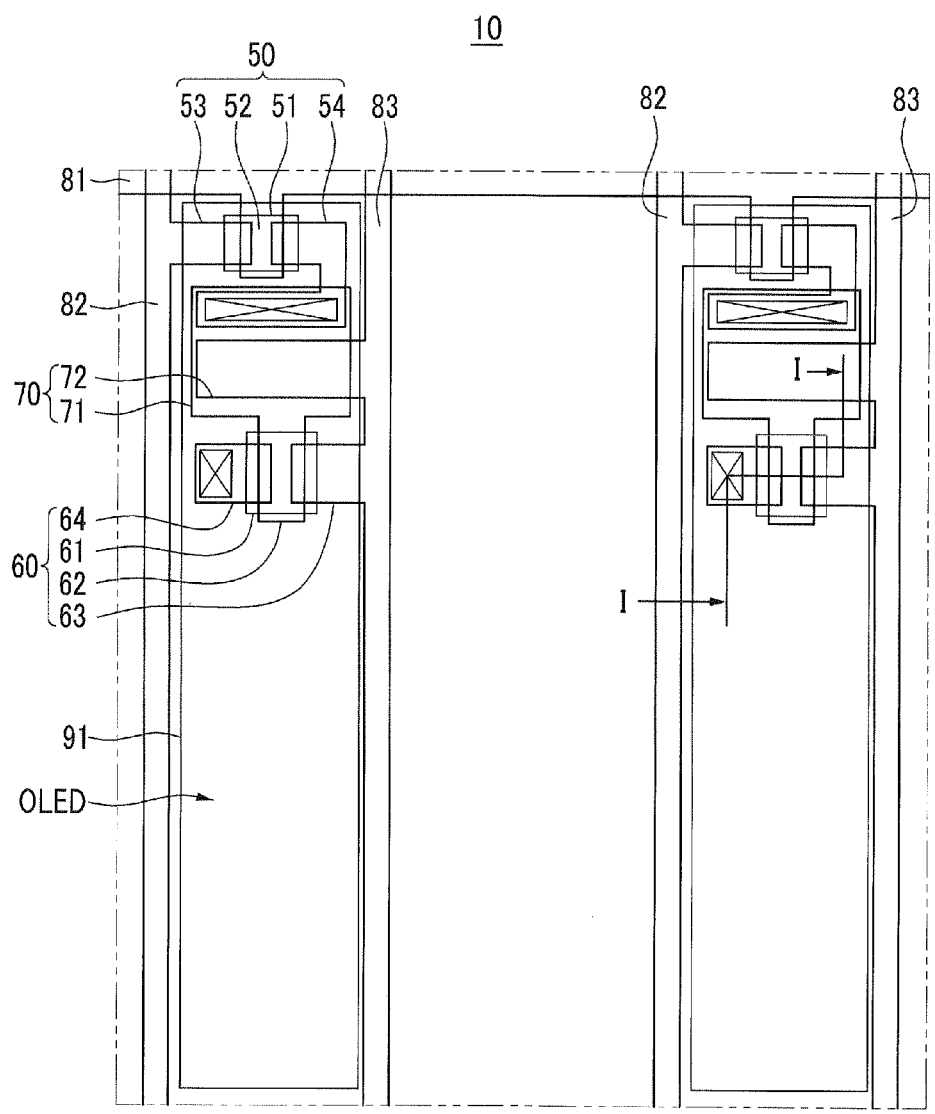
FIG. 8 is a layout view of a pixel structure of the flexible display panel shown in FIG. 2.
Figure 9:
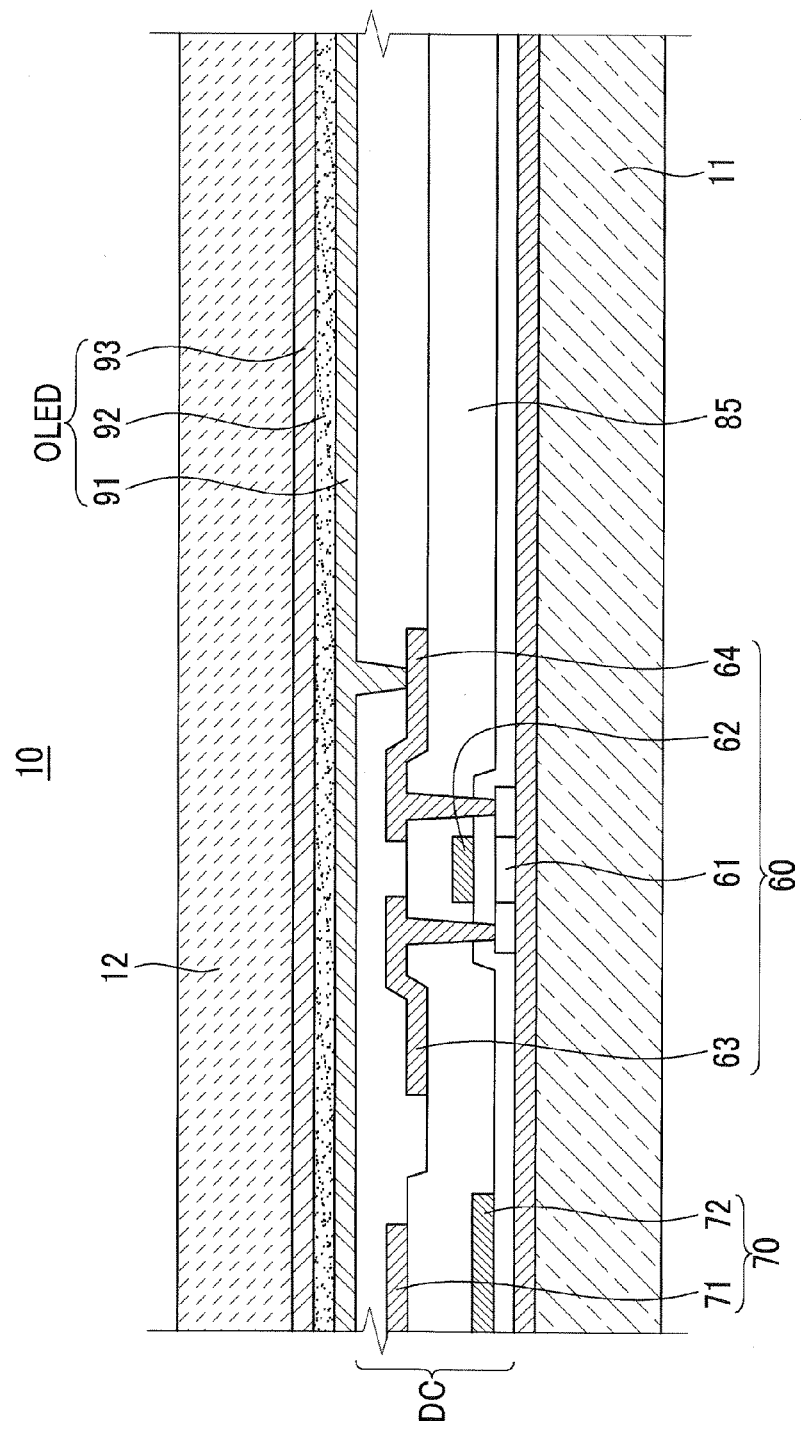
FIG. 9 is a cross sectional view of the flexible display panel of FIG. 8 taken along the line I-I.

FIG. 8 is a layout view of a pixel structure of the flexible display panel shown in FIG. 2, and FIG. 9 is a cross-sectional view of the flexible display panel of FIG. 8 taken along the line I-I. The flexible display panel 10 is not limited to a structure that is described later, and may be formed with an organic light emitting diode (OLED) display or a flexible liquid crystal display (LCD) of a different structure.

Referring to FIG. 8 and FIG. 9, each pixel of the flexible display panel 10 includes a pixel circuit DC and an organic light emitting diode (OLED). The pixel circuit DC basically includes a switching thin film transistor 50, a driving thin film transistor 60, and a capacitor 70. Also, the flexible display panel 10 includes a gate line 81 formed according to one direction, and a data line 82 and a common power line 83 insulated from and crossing the gate line 81.

Here, one pixel may be defined by boundaries of the gate line 81, the data line 82, and the common power line 83, however it is not away limited thereto. The pixel is a basic unit displaying an image, and the flexible display panel 10 displays an image through a plurality of pixels.

In FIG. 8, an active matrix type of flexible display panel 10 of a 2Tr-1Cap structure in which one pixel includes two thin film transistors 50 and 60 and one capacitor 70 is provided, however the structure of the flexible display panel 10 is not limited to the example shown. The flexible display panel 10 may include three or more thin film transistors and two or more capacitors, and various structures further including separate wires may be formed.

The organic light emitting diode (OLED) may include a pixel electrode 91, an organic emission layer 92, and a common electrode 93. One of the pixel electrode 91 and the common electrode 93 may be a hole injection electrode and the other may be an electron injection electrode. Electrons and holes are injected from the pixel electrode 91 and the common electrode 93 to the organic emission layer 92, and light emitting is realized when excitons of which holes and electrons are combined is dropped from an exited state to a ground state.

The pixel electrode 91 is formed of a highly reflective metal, and the common electrode 93 may be formed as a transparent conductive layer. In this case, the light of the organic emission layer 92 is reflected by the pixel electrode 91, and the light passes through the common electrode 93 and an encapsulation substrate 12 to be emitted to the outside. In FIG. 9, reference numeral 11 indicates a flexible substrate.

The capacitor 70 includes a pair of capacitor electrodes 71 and 72 disposed via an interlayer insulating layer 85 as a dielectric material interposed therebetween. Capacitance is determined by a charge charged to the charged capacitor 70 and the voltage between the two capacitor electrodes 71 and 72.

The switching thin film transistor 50 may include a switching semiconductor layer 51, a switching gate electrode 52, a switching source electrode 53, and a switching drain electrode 54. The driving thin film transistor 60 includes a driving semiconductor layer 61, a driving gate electrode 62, a driving source electrode 63, and a driving drain electrode 64.

The switching thin film transistor 50 may be used as a switch selecting the pixel to being light-emitted. The switching gate electrode 52 may be connected to the gate line 81. The switching source electrode 53 may be connected to the data line 82, and the switching drain electrode 54 is connected to any one capacitor electrode 71.

The driving thin film transistor 60 applies driving power for light emitting the organic emission layer 92 of the selected pixel of the pixel electrode 91. The driving gate electrode 62 is connected to the one capacitor electrode 71 connected to the switching drain electrode 54. The driving source electrode 63 and the other capacitor electrode 72 are connected to the common power line 83. The driving drain electrode 64 may be connected to the pixel electrode 91 of the organic light emitting diode (OLED) through a contact hole.

The switching thin film transistor 50 is operated by the gate voltage applied to the gate line 81 to transmit the data voltage applied to the data line 82 to the driving thin film transistor 60. A voltage corresponding to a difference between a common voltage applied to the driving thin film transistor 60 from the common power line 83 and the data voltage transmitted from the switching thin film transistor 50 is stored to the capacitor 70, and a current corresponding to the voltage stored to the capacitor 70 flows to the organic light emitting diode (OLED) through the driving thin film transistor 60 thereby light-emitting the organic emission layer 92.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A foldable display device, comprising:
   a flexible display panel; and
   a cover window overlying the flexible display panel,
   said cover window including a folding region operated to be folded or unfolded, positioned to transmit images generated by the flexible display panel where recesses are formed and overlying a display region of the display panel.

2. The foldable display device of claim 1, comprised of the recesses formed in a stripe pattern, and positioned in alignment with a direction crossing a direction in which the cover window is folded.

3. The foldable display device of claim 2, comprised of each length of the recesses being the same as a width of the cover window.

4. The foldable display device of claim 1, comprised of the recesses formed with a dot shape, and positioned according to a first direction in which the cover window is folded and a second direction crossing the first direction.

5. The foldable display device of claim 1, comprised of the recesses formed with a bar shape,
   the cover window folded according to a first direction, and each long edge of the recesses positioned according to a second direction crossing the first direction.

6. The foldable display device of claim 1, comprised of the recesses including first recesses of a bar shape and second recesses of a dot shape.

7. The foldable display device of claim 6, comprised of the first recesses and the second recesses alternately positioned one by one according to a second direction crossing a first direction in which the cover window is folded.

8. The foldable display device of claim 2, comprised of each width of the recesses and an interval of the recesses determined in a range of 40 nm to 100 nm.

9. The foldable display device of claim 8, comprised of each depth of the recesses being less than half of a thickness of the cover window.

10. The foldable display device of claim 1, comprised of the cover window manufactured of a hard material and a pair of non-folding regions positioned at respective sides of the folding region.

11. The foldable display device of claim 10, comprised of the cover window being a single layer structure or a multi-layer structure including at least one of an acryl, a polycarbonate, and polyethylene terephthalate.

12. The foldable display device of claim 10, further comprising:
    a supporting member supporting the flexible display panel and the cover window,
    the supporting member including a hinge part corresponding to the folding region and a first supporting part and a second supporting part respectively corresponding to a pair of non-folding regions.

13. A foldable display device, comprising:
    a flexible display panel; and
    a cover window including a folding region operated to be folded or unfolded overlying the flexible display panel to transmit images generated by the flexible display panel where recesses are formed in a stripe pattern and positioned in alignment with a direction crossing a direction in which the cover window is folded.

14. The foldable display device of claim 13, comprised of each length of the recesses being the same as a width of the cover window.

15. The foldable display device of claim 13, comprised of each width of the recesses and an interval of the recesses determined in a range of 40 nm to 100 nm.

16. The foldable display device of claim 15, comprised of each depth of the recesses being less than half of a thickness of the cover window.

17. The foldable display device of claim 13, comprised of the cover window manufactured of a hard material and a pair of non-folding regions positioned at respective sides of the folding region.

18. The foldable display device of claim 17, comprised of the cover window being a single layer structure or a multi-layer structure including at least one of an acryl, a polycarbonate, and polyethylene terephthalate.

19. The foldable display device of claim 17, further comprising:
    a supporting member supporting the flexible display panel and the cover window,
    the supporting member including a hinge part corresponding to the folding region and a first supporting part and a second supporting part respectively corresponding to a pair of non-folding regions.

* * * * *